(12) United States Patent
Dao

(10) Patent No.: US 12,074,604 B2
(45) Date of Patent: Aug. 27, 2024

(54) CIRCUITS AND METHODS FOR GENERATING DATA OUTPUTS UTILIZED SHARED CLOCK-ACTIVATED TRANSISTORS

(71) Applicant: Steve Dao, Houston, TX (US)

(72) Inventor: Steve Dao, Houston, TX (US)

( * ) Notice: Subject to any disclaimer, the term of this patent is extended or adjusted under 35 U.S.C. 154(b) by 191 days.

(21) Appl. No.: 17/747,899

(22) Filed: May 18, 2022

(65) Prior Publication Data
US 2023/0378940 A1    Nov. 23, 2023

(51) Int. Cl.
*H03K 3/3562*    (2006.01)
*H03K 3/012*    (2006.01)
*H03K 19/096*    (2006.01)

(52) U.S. Cl.
CPC ......... *H03K 3/35625* (2013.01); *H03K 3/012* (2013.01); *H03K 19/0963* (2013.01)

(58) Field of Classification Search
CPC .............. H03K 3/35625; H03K 3/012; H03K 19/0963; H03K 3/356139
See application file for complete search history.

(56) References Cited

U.S. PATENT DOCUMENTS

| | | | |
|---|---|---|---|
| 5,825,224 A * | 10/1998 | Klass | H03K 3/356139 327/218 |
| 8,373,483 B2 | 2/2013 | Dally | |
| 9,667,230 B1 | 5/2017 | Fojtik et al. | |
| 11,018,653 B1 | 5/2021 | Venugopal et al. | |
| 2004/0150449 A1 | 8/2004 | Durham et al. | |
| 2015/0028927 A1* | 1/2015 | Elkin | H03K 3/0372 327/203 |
| 2016/0322962 A1* | 11/2016 | Hsu | H03K 3/35625 |
| 2021/0175876 A1 | 6/2021 | Lai et al. | |

* cited by examiner

*Primary Examiner* — Daniel D Chang
(74) *Attorney, Agent, or Firm* — Southern Methodist University Dedman School of Law

(57) ABSTRACT

Circuits, methods, and systems for generating data outputs based on sampled data inputs. One circuit includes a first latch including a first logic gate, a second logic gate, and a first keeper subcircuit. The circuit further includes a second latch including a third logic gate, a fourth logic gate, and a second keeper subcircuit. The first keeper subcircuit being electrically coupled via a first shared node of the first latch and the second latch, and the second keeper subcircuit being electrically coupled via a second shared node of the first latch and the second latch.

16 Claims, 10 Drawing Sheets

CIRCUITS AND METHODS FOR GENERATING DATA OUTPUTS UTILIZED SHARED CLOCK-ACTIVATED TRANSISTORS

BACKGROUND

The present disclosure relates generally to the field of integrated circuit technology. In an integrated circuit design such as very large scale integration (VLSI) systems, there can be a plurality of flip-flops including a plurality of transistors.

SUMMARY

Implementations described herein relate to circuits and techniques for generating data outputs based on sampled data inputs. The circuit includes a first latch and a second latch. The first latch includes a first logic gate electrically coupled to a second output of a second logic gate. Further, the first latch includes the second logic gate electrically coupled to a first output of the first logic gate. Further, the first latch includes a first keeper subcircuit electrically coupled to a first intermediate node of the first logic gate and a second intermediate node of the second logic gate. The second latch includes a third logic gate electrically coupled to the second output of the second logic gate and a fourth output of a fourth logic gate. Further, the second latch includes the fourth logic gate electrically coupled to the first output of the first logic gate and a third output of the third logic gate. Further, the second latch includes a second keeper subcircuit electrically coupled to a third intermediate node of the third logic gate and a fourth intermediate node of the fourth logic gate. Further, wherein the first keeper subcircuit is electrically coupled via a first shared node of the first latch and the second latch, wherein the second keeper subcircuit is electrically coupled via a second shared node of the first latch and the second latch.

In some implementations, the first latch further includes a first clock-activated transistor configured to enable sampling of a main input signal by the first logic gate and an inverted main input signal by the second logic gate, and a plurality of storage nodes configured to store a latched data bit of the main input signal and store a latched data bit of the inverted main input signal, wherein the plurality of storage nodes are electrically coupled to the first output of the first logic gate and the second output of the second logic gate.

In various implementations, the second latch further includes a second clock-activated transistor configured to enable sampling of the first output of the first logic gate and the second output of the second logic gate.

In some implementations, the first keeper subcircuit is clock-gated by the second clock-activated transistor of the second latch, and wherein the second keeper subcircuit is clock-gated by the first clock-activated transistor of the first latch.

In various implementations, the first logic gate includes a first pull-up network and a first pull-down network, and wherein the second logic gate includes a second pull-up network and a second pull-down network, and wherein the first pull-up network includes at least a first transistor and a second transistor, and wherein the second pull-up network includes at least a third transistor and a fourth transistor, and wherein the first transistor and the third transistor are clock-gated by the first clock-activated transistor of the first latch.

In some implementations, the third logic gate includes a third pull-up network and a third pull-down network, and wherein the fourth logic gate includes a fourth pull-up network and a fourth pull-down network, and wherein the third pull-down network includes at least a fifth transistor and a sixth transistor, and wherein the fourth pull-down network includes at least a seventh transistor and an eighth transistor, and wherein the fifth transistor and the seventh transistor are clock-gated by the second clock-activated transistor of the second latch.

In various implementations, the first keeper subcircuit is activated by the first intermediate node or the second intermediate node in response to a change in the main input signal when a clock signal is at a second level, and wherein the second keeper subcircuit is activated by the third intermediate node or the fourth intermediate node in response to a change in the first output and the second output of the first latch when the clock signal is at a first level.

In some implementations, the first intermediate node and the second intermediate node are electrically coupled to the inputs of the first keeper subcircuit, and wherein a top-most transistor of the first pull-down network in the first logic gate is electrically coupled to the main input signal, and wherein a top-most transistor of the second pull-down network of the second logic gate is electrically coupled to the inverted main input signal.

In various implementations, the third intermediate node and the fourth intermediate node are electrically coupled to the inputs of the second keeper subcircuit, and wherein bottom-most transistor of the third pull-up network in the third logic gate is electrically coupled to the second output of the second logic gate, and wherein the bottom-most transistor of the fourth pull-up network of the fourth logic gate is electrically coupled to the first output of the first logic gate.

In some implementations, the first keeper subcircuit is electrically coupled to the outputs of the first latch, and the second keeper subcircuit is electrically coupled to the outputs of the second latch, and wherein the operation of the circuit is fully static, and wherein each of a plurality of nodes of the circuit remains untoggled while the main input signal remains constant, and wherein at most two transistor gate loads are presented to a clock signal.

Some implementations relate to a method for generating data outputs based on sampled data inputs. The method includes, when a clock signal is at a first level, sampling, by a first latch, a data bit, and storing, by a second latch, a previous data bit. Further, the method includes, when the clock signal is at a second level, receiving, by the second latch, the data bit from the first latch, and transmitting, by the second latch, an output signal based on the data bit, wherein a first keeper subcircuit is electrically coupled via a first shared node of the first latch and the second latch, wherein a second keeper subcircuit is electrically coupled via a second shared node of the first latch and the second latch.

In some implementations, the first latch is electrically coupled to the second latch via a plurality of nodes, and wherein the first latch and the second latch share a low-power supply node and a high-power supply node, and wherein the high-power supply node is electrically coupled a first clock-activated transistor, and wherein the low-power supply node is electrically coupled a second clock-activated transistor.

In various implementations, the first latch includes a first logic gate, a second logic gate, and the first keeper subcircuit, and wherein the first keeper subcircuit is electrically coupled to a first intermediate node and a second intermediate node, and wherein the first keeper subcircuit includes at least a first transistor and a second transistor.

In some implementations, the first transistor is electrically coupled to the first intermediate node and the second transistor is electrically coupled to the second intermediate node.

In various implementations, both the first transistor and the second transistor are electrically cross coupled to the first intermediate node and the second intermediate node without electrically coupling to a low-power supply node or a high-power supply node.

In some implementations, the first keeper subcircuit is electrically coupled to a low-power supply node, and wherein the first keeper subcircuit is electrically coupled to storage nodes of the first latch, and wherein the first keeper subcircuit includes at most two transistors or at most four transistors.

In various implementations, the second latch includes a third logic gate, a fourth logic gate, and the second keeper subcircuit, wherein the second keeper subcircuit is electrically coupled to a third intermediate node and a fourth intermediate node, and wherein the second keeper subcircuit includes at least a third transistor and a fourth transistor, and wherein the third transistor is electrically coupled to the fourth intermediate node and the fourth transistor is electrically coupled to the third intermediate node.

In some implementations, the second keeper subcircuit is electrically coupled to a high-power supply node, and wherein the second keeper subcircuit is electrically coupled to storage nodes of the second latch.

In various implementations, the second keeper subcircuit is electrically coupled to a high-power supply node, and wherein the second keeper subcircuit is electrically coupled to storage nodes of the first latch, and wherein the second keeper subcircuit includes at most two transistors or at most four transistors.

Various implementations described herein relate to circuits and techniques for generating data outputs based on sampled data inputs. The circuit includes a first latch and a second latch. The first latch includes a first logic gate including a first input and a second input, wherein the first input is electrically coupled to an input signal, and the second input is electrically coupled to an output of a second logic gate. Further, the first latch includes a second logic gate including a third input and a fourth input, wherein the third input is electrically coupled to an inverted input signal, and the fourth input is electrically coupled to the output of the first logic gate. Further, the first latch includes a first keeper subcircuit electrically coupled to an intermediate node of the first logic gate and an intermediate node of the second logic gate. Further, the first latch includes a first plurality of storage nodes. Further, the first latch includes a first clock-activated transistor configured to enable sampling of the input signal by the first logic gate and the inverted input signal by the second logic gate. The second latch includes a third logic gate including a fifth input and a sixth input, wherein the fifth input is electrically coupled to the output of the second logic gate, and the sixth input is electrically coupled to an output of a fourth logic gate. Further, the second latch includes a fourth logic gate including a seventh input and an eighth input, wherein the seventh input is electrically coupled to the output of the first logic gate, and the eighth input is electrically coupled to an output of the third logic gate. Further, the second latch includes a second keeper subcircuit electrically coupled to an intermediate node of the third logic gate and an intermediate node of the fourth logic gate. Further, the second latch includes a second plurality of storage nodes. Further, the second latch includes a second clock-activated transistor configured to enable sampling of the outputs of the first latch. Further, wherein the first keeper subcircuit is electrically coupled via a first shared node of the first latch and the second latch, wherein the second keeper subcircuit is electrically coupled via a second shared node of the first latch and the second latch.

Figure 1A:
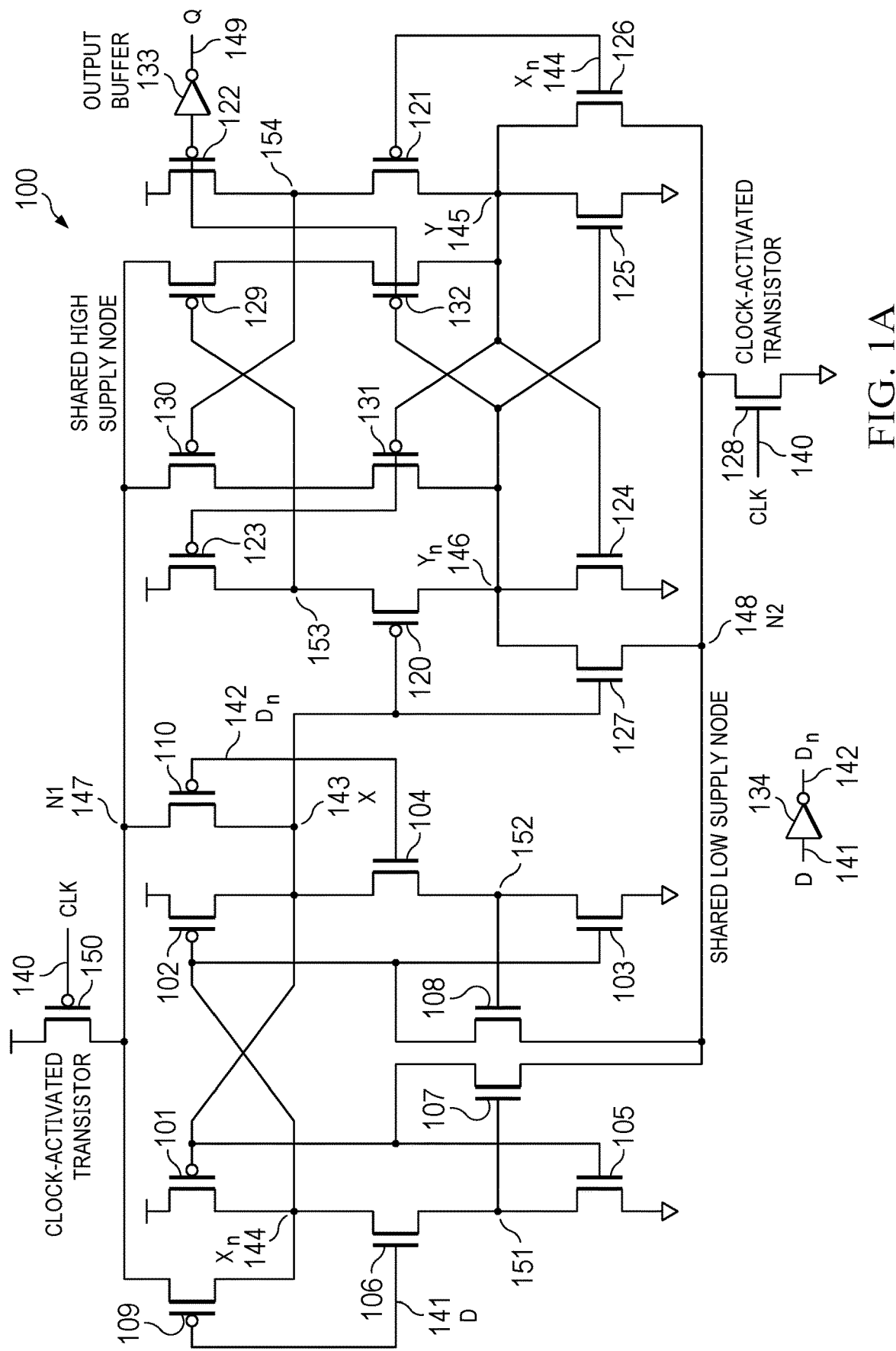
FIG. 1A is a circuit diagram illustrating a shared clock-activated transistor architecture, according to an illustrative implementation.

It will be recognized that some or all of the figures are schematic representations for purposes of illustration. The figures are provided for the purpose of illustrating one or more embodiments with the explicit understanding that they will not be used to limit the scope or the meaning of the claims.

DETAILED DESCRIPTION

Referring generally to the figures, the systems and methods relate to circuits and techniques for generating data outputs utilizing shared clock-activated transistors, particularly in very large large-scale integration (VLSI) systems such as central processing units (CPUs), graphics processing units (GPUs), system-on-a-chip (SOC), and internet of things (IoT) devices.

In many highly pipelined microprocessor systems, flip-flops are used in each pipeline stage to divide the processing logic for higher performance gains. Low power has become a dominant design priority with rise of mobile and battery operated ecosystem. Chief contributor to the power consumption of a digital system is the clock network, namely the large number of transistors that can be coupled to the clock network and are driven by the clock signal. That is, the large number of clock-coupled transistors inside a flip-flop burdens the clock signal. For example, a conventional flip-flop can have up to 12 transistors coupled to the clock signal (referred to herein as "clock-activated transistors"). Accordingly, many digital systems like CPUs or SOCs can have upwards of one hundred thousand to over millions of flip-flops, and the clock network in the digital systems can account for up to forty percent (40%) of the total power consumption. Thus, reducing the number of clock-activated transistors per flip-flop reduces the burden on the clock network and thus, reduces the total power consumption of the digital system. Furthermore, reducing total power consumption of clock networks by incorporating shared clock-activated transistors and keeper subcircuits improves flip-flop circuit architectures while (1) avoiding (or reducing) contentions within the digital system, (2) reducing voltage drops across nodes of the digital system, and (3) restricting toggling of internal nodes when the main input signal is constant.

Additionally, because the data activity factor (e.g., the fraction of time the data input toggles) in a flip-flop is typically five to ten percent (5-10%), a flip-flop should have no (or little) internal nodes toggling when the input signal is constant and thereby, further reducing the total power consumption of the digital system. However, in some highly pipelined microprocessor systems, clock-gating techniques can include using clock-activated transistors within subcircuits, which can in turn increases the burden on the clock signal. Accordingly, an improved flip-flop circuit architecture is disclosed that that reduces the number of clock-activated transistor and thus, (1) reduces the clock load, (2) eliminates (or reduces) internal node toggling while the data input is constant, and (3) utilizes keeper subcircuits without additional clock-activated transistors by clock-gating via shared high or low-supply node for fully-static operation. Therefore, aspects of the present disclosure address problems in existing flip-flop circuit architectures by providing an improved power consumption technique utilizing shared clock-activated transistors that reduces the transistor load on the clock network by up to eighty percent (80%). Furthermore, aspects of the present disclosure incorporate keeper subcircuit techniques that enable flip-flop circuits to remain fully-static and operate contention free (or near contention free). Additionally, while dependence on the clock network is reduced, aspects of the present disclosure also avoid dependency on sizing relationship of transistor thereby allowing the various circuits described herein to be insensitive to process variation (e.g., attributes of transistors such as length, widths, oxide thickness).

The present implementations will now be described in detail with reference to the drawings, which are provided as illustrative examples of the implementations so as to enable those skilled in the art to practice the implementations and alternatives apparent to those skilled in the art. Notably, the figures and examples below are not meant to limit the scope of the present implementations to a single implementation. Other implementations are possible by way of interchange of some or all of the described or illustrated elements. Moreover, where certain elements of the present implementations can be partially or fully implemented using known components, only those portions of such known components that are necessary for an understanding of the present implementations will be described, and detailed descriptions of other portions of such known components will be omitted so as not to obscure the present implementations. In the present specification, an implementation showing a singular component should not be considered limiting; rather, the present disclosure is intended to encompass other implementations including a plurality of the same component, and vice-versa, unless explicitly stated otherwise herein. Moreover, applicants do not intend for any term in the specification or claims to be ascribed an uncommon or special meaning unless explicitly set forth as such. Further, the present implementations encompass present and future known equivalents to the known components referred to herein by way of illustration.

In general, a Metal-Oxide Semiconductor Field-Effect Transistor (MOSFET) describes a type of transconductive device that may be used in modern VLSI systems. MOSFETs are designed as one of two basic types, n-channel and p-channel. N-channel MOSFETs open a conductive path between the source and drain when a positive voltage greater than the device's threshold voltage ($V_T$) is applied from the gate to the source. P-channel MOSFETs open a conductive path when a voltage greater than the device's threshold voltage is applied from the source to the gate. Complimentary MOSFET (CMOS) describes a circuit designed with a mix of n-channel and p-channel MOSFETs. In CMOS designs, n-channel and p-channel may be arranged such that a second level on the gate of a MOSFET turns an n-channel device on (e.g., opens a conductive path), and turns a p-channel MOSFET off (e.g., closes conductive path). Conversely, a first level on the gate of a MOSFET turns a p-channel on and an n-channel off. It should be understood that while CMOS logic is used in the examples, any suitable digital logic process may be used for the circuits described herein. Furthermore, all drawings depict n-channel and p-channel MOSFETs as three terminal devices including of drain, gate, and source unless stated otherwise. Moreover, the fourth terminal being the body substrate is assumed to be coupled to low-power supply for n-channel and high-power supply for p-channel unless stated otherwise.

Figure 1B:
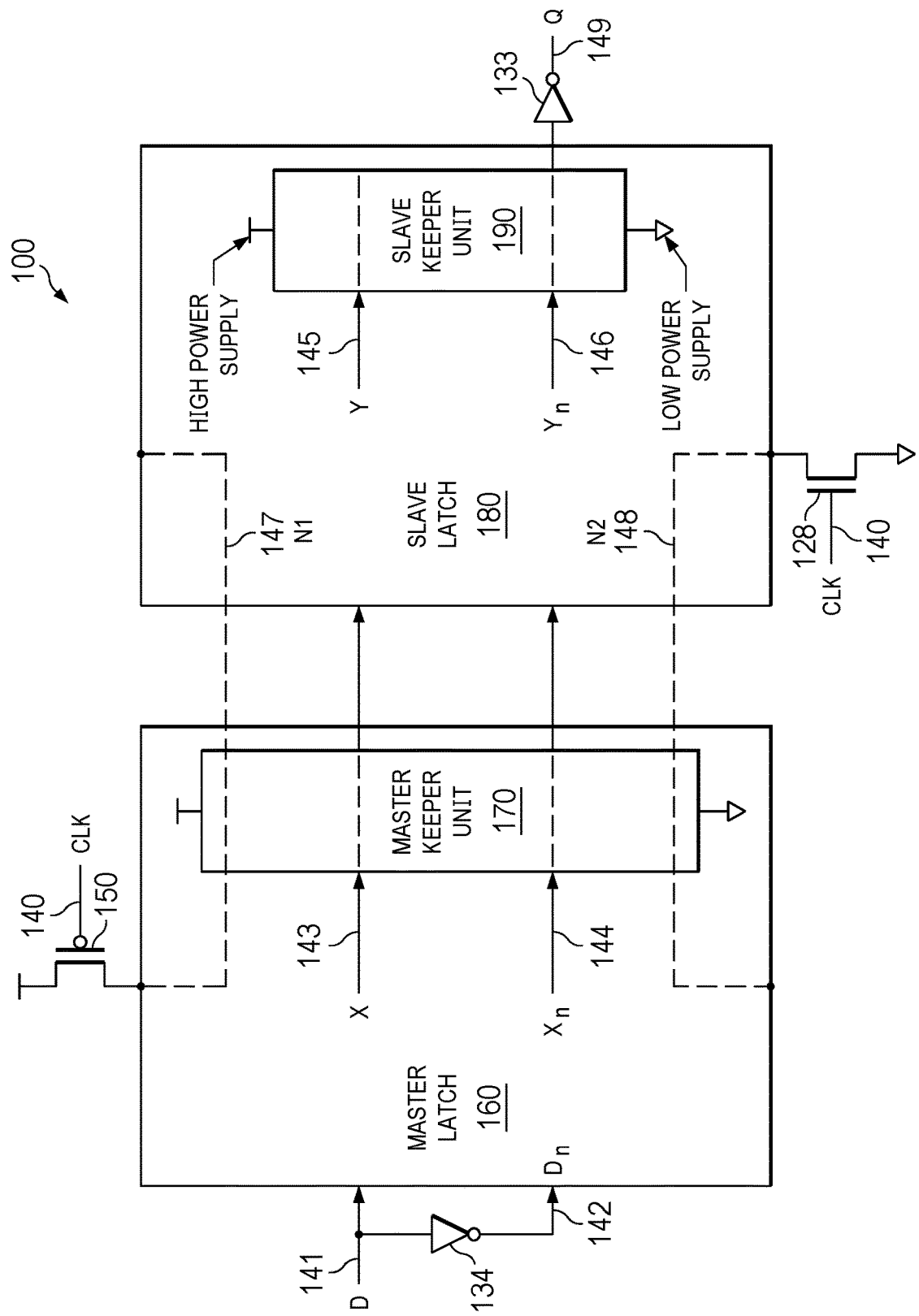
FIG. 1B is a block diagram illustrating the shared clock-activated transistor architecture of FIG. 1A, according to an illustrative implementation.

Referring to FIGS. 1A-1B in general, the shared clock-activated transistor architecture 100 (hereafter referred to herein as "transistor architecture 100") includes back-to-back latches with a master latch 160 followed by a master keeper unit 170 (sometime referred to herein as a "master keeper subcircuit" or a "first keeper subcircuit"), a slave latch 180, and a slave keeper unit 190 (sometime referred to herein as a "slave keeper subcircuit" or a "second keeper subcircuit"). In various implementations, master latch 160 is transparent and samples the main input signal 141 when clock signal 140 is at a first level (e.g., low). Conversely, master latch 160 is opaque blocking any changes in main input signal 141 from propagating to slave latch 180 when clock signal 140 is at a second level (e.g., high). In some implementations, the output of master latch 160 is the input to slave latch 180 such that slave latch 180 is active when the clock signal 140 transitions to a second level and generates an output signal 149 depending on the level of the sampled input signal (e.g., outputs of the master latch) from master latch 160. Conversely, slave latch 180 stores the sampled input signal of master latch 160 when clock signal 140 is a first level and maintains the output signal 149 stable. Accordingly, the output signal 149 of the flip-flop can change on the rising edge (or falling edge depending on the configuration) of clock signal 140 for each clock cycle if the main input signal 141 has changed prior to the rising edge of clock signal 140.

Referring now to FIG. 1A, a circuit diagram illustrating a shared clock-activated transistor architecture 100, according to an illustrative implementation. In broad view, transistors 101 through 110 (101-110) and transistor 150 are components of the master latch (e.g., master latch 160 and master keeper unit 170 in FIG. 1B). Transistors 120 through 132 (120-132) are components of the slave latch (e.g., slave latch 180 and slave keeper unit 190 in FIG. 1B). In some implementations, clock-activated transistor 150 can serve the pull-up network, via shared node 147 (shown as "N1"), of the master latch when clock signal 140 is at a first level (e.g., low) and master latch is transparent. In various implementations, clock-activated transistor 128 can serve the pull-down network, via shared node 148 (shown as "N2"), of slave latch when clock signal 140 is at a second level (e.g., high) and slave latch is transparent.

In various implementations, the master latch can include two cross-coupled logic gates (e.g., NAND), a keeper subcircuit, and a clock-activated pull-up transistor. In particular, a first logic gate of the two cross-coupled logic gates includes transistors 101, 105, 106, and 109, a first input (shown as "D" and also referred to herein as "main input signal 141"), and a second input (shown as "143" and "X" and also referred to herein as "storage node X"). A second logic gate of the two cross-coupled logic gates includes transistors 102, 103, 104, and 110, a third input (shown as "$D_n$" and also referred to herein as "inverted main input signal 142"), and a fourth input (shown as "144" and "$X_n$" and also referred to herein as a "storage node $X_n$"). Inverted main input signal 142 is inverted based on inverter 134 receiving main input signal 141. As shown, the second input X of the first logic gate is an output of the second logic gate and the fourth input $X_n$ of the second logic gate is an output of the first logic gate. Accordingly, the first logic gate and second logic gates are electrically cross-coupled. Furthermore, the storage nodes of the master latch (e.g., X and $X_n$) can be configured to store a latched data bit of main input signal 141 and a latched data bit of inverted main input signal 142. In particular, storage node X latching the latched data bit of main input signal 141 is electrically coupled to the output of the second logic gate. In some implementations, storage node X further electrically couples to transistors 101, 102, 104, 105, 110, 120, and 127. Additionally, storage node $X_n$ latching the latched data bit of inverted main input signal 142 is electrically coupled to the output of the first logic gate. In various implementations, storage node $X_n$ further electrically couples to transistors 101, 102, 103, 106, 109, 121, and 126.

In some implementations, both the first logic gate and second logic gate of the master latch (e.g., 160) can be coupled to a clock-activated transistor 150, via shared node 147 (shown as "N1" and also referred to herein as "shared high supply node"). Clock-activated transistor 150 can be activated and deactivated based on clock signal 140. For example, clock-activated transistor 150 can be activated upon a rising edge of clock signal 140 (e.g., going from a first level to a second level). In another example, clock-activated transistor 150 can be activated upon a falling edge of clock signal 140 (e.g., going from a second level to a first level). In various implementations, clock-activated transistor 150 can be configured to enable sampling of main input signal 141 by the first logic gate (in particular transistors 106 and 109) and inverted main input signal 142 by the second logic gate (in particular transistors 104 and 110).

In various implementations, each logic gate (e.g., first, second, third, fourth) includes a pull-up network and a pull-down network. For example, the first logic gate includes a first pull-up network including transistors 101 and 109 and a first pull-down network including transistors 105 and 106. In yet another example, the second logic gate includes a second pull-up network including transistors 102 and 110 and a second pull-down network including transistors 103 and 104.

The first keeper subcircuit (sometimes referred to herein as the "first keeper subcircuit") of (or within) the master latch can include transistor 107 and 108. In some implementations, the first keeper subcircuit of the master latch is shown to be clock-gated by clock-activated transistor 128 (sometimes referred to herein as the "second clock-activated transistor") of the slave latch, via shared node 148 (shown as "N2" and also referred to herein as "shared low supply node"). In particular, the source terminals of transistors 107 and 108 can be electrically coupled to the drain terminal of clock-activated transistor 128 of the slave latch.

In some implementations, when the master latch is opaque (e.g., clock signal 140 is at a second level (e.g., high)) and main input signal 141 or inverted main input signal 142 changes, storage node X or $X_n$ maintains a current path to low power supply via transistors 107 and 128 for storage node X and via transistors 108 and 128 for storage node $X_n$. However, when clock signal 140 transitions to a first level (e.g., low), the master latch is active and transistor 109 pull-up storage node $X_n$ via clock-activated transistor 150 to high power supply when input signal 141 is at a first level, or transistor 110 pull-up storage node X via clock-activated transistor 150 to high power supply when inverted input signal 142 is at a first level. When storage node $X_n$ transitions to a second level, transistor 103 is activated to pull-down storage node X to a first level. Likewise, when storage node X transitions to a second level, transistor 105 is activated to pull-down storage node $X_n$ to a first level. Despite transistor 107 or 108 being active when clock signal 140 transitions to a first level (e.g., low), storage node X or $X_n$ is shown to be cut-off from low power supply by de-activating clock-activated transistor 128, and thereby allowing storage node X or $X_n$ to transition to a second level (e.g., high).

In some implementations, drain terminals of transistors 107 and 108 can be electrically coupled to storage node X and $X_n$, respectively, and gate terminals of transistors 107 and 108 can be electrically coupled to first intermediate node 151 and second intermediate node 152, respectively. The first keeper subcircuit, including transistors 107 and 108, can be activated by the first intermediate node 151 or second intermediate node 152 in response to a change in the input signal 141 when clock signal 140 is at a second level while the master latch is opaque. In various implementations, the gate terminal of first top-most transistor 106 is electrically coupled to main input signal 141, and the gate terminal of second top-most transistor 104 is electrically coupled to inverted main input signal 142. Thus, when input signal 141 changes from first level to a second level while clock signal 140 is at a second level, the first top-most transistor 106 is activated and conducts a voltage value of $V_{DD}$-$V_T$ to the first intermediate node 151 electrically coupled to gate terminal of transistor 107, where $V_{DD}$ is the value of the high power supply, and $V_T$ is the threshold voltage of the transistor. Transistor 107 is activated to provide storage node X 143 with a current path via transistors 107 and 128 to low power supply, thereby maintaining storage node X 143 at a first level. Conversely, when inverted input signal 142 changes from first level to a second level while clock signal 140 is at a second level, second top-most transistor 104 can be activated and conducts a voltage value of $V_{DD}$-$V_T$ to the second intermediate node 152 electrically coupled to gate terminal of transistor 108. In some implementations, transistor 108 can be activated to provide storage node $X_n$ 144 with a current path, via transistors 108 and 128, to low power supply, thereby maintaining storage node $X_n$ 144 at a first level.

In various implementations, when input signal 141 is at a second level, transistor 110 can be activated. When clock signal 140 transitions to a first level, clock-activated transistor 128 can be deactivated to cutoff one current path to low power supply and enables storage node X 143 to pull-up to high power supply via transistors 110 and 150. In some implementations, when storage node X 143 transitions to a second level, first bottom-most transistor 105 with gate terminal electrically coupled to storage node X 143 is activated and thereby, pulls-down the gate terminal of transistor 107 to low power supply to deactivate the first keeper subcircuit within the master latch. Additionally, when input signal 141 is at a first level, transistor 109 can be activated. When clock signal 140 transitions to a first level, clock-activated transistor 128 can be deactivated to cutoff one current path to low power supply and enables storage node $X_n$ 144 to pull-up to high power supply via transistors 109 and 150. When storage node $X_n$ 144 transitions to a second level, second bottom-most transistor 103 with gate terminal electrically coupled to storage node $X_n$ 144 can be activated and thereby, pull-down the gate terminal of transistor 108 to low power supply to deactivate the first keeper subcircuit within the master latch.

Furthermore, the keeper subcircuit of the master latch is activated in response to a change in an input signal (e.g., 141 and/or 142) when clock signal 140 is at a specific level (e.g., at a first level or at a second level). The keeper subcircuit of the master latch can be electrically coupled to a first intermediate node 151 of the first logic gate and a second intermediate node 152 of the second logic gate. As shown, the top-most transistor (transistor 106) of the pull-down network in the first logic gate is electrically coupled to main input signal 141 and the top-most transistor (transistor 104) of the pull-down network of the second logic gate is electrically coupled to inverted main input signal 142.

In various implementations, the slave latch can include two cross-coupled logic gates (e.g., NOR), a keeper subcircuit, and a clock-activated pull-down transistor. In particular, a third logic gate of the two cross-coupled logic gates includes transistors 120, 123, 124, and 127, a fifth input (shown as "143" and "X" and also referred to herein as "storage node X"), and a sixth input (shown as "145" and "Y" and also referred to herein as "storage node Y"). A fourth logic gate of the two cross-coupled logic gates includes transistors 121, 122, 125, and 126, a seventh input (shown as "144" and "$X_n$" and also referred to herein as the "storage node $X_n$"), and an eighth input (shown as "146" and "$Y_n$" and also referred to herein as a "storage node $Y_n$"). As shown, the sixth input Y of the third logic gate is the output of the fourth logic gate and the eighth input $Y_n$ of the fourth logic gate is the output of the third logic gate. Accordingly, the third logic gate and fourth logic gates are electrically cross-coupled. Furthermore, the storage nodes of the slave latch (e.g., Y and $Y_n$) can be configured to store a latched data bit of storage node X and a latched data bit of storage node $X_n$. In particular, storage node Y latching the latched data bit of storage node X is electrically coupled to the output of the fourth logic gate, and storage node Y further electrically couples to transistors 121, 123, 124, 125, 126, 131, and 132. Additionally, storage node $Y_n$ latching the latched data bit of storage node $X_n$ can be electrically coupled to the output of the third logic gate, and storage node $Y_n$ further electrically couples to transistors 120, 122, 124, 125, 127, 131, 132, and the input of output buffer 133.

In some implementations, both the third logic gate and fourth logic gate of the slave latch (e.g., 180) can be coupled to a clock-activated transistor 128, via shared node 148. Clock-activated transistor 128 can be activated and deactivated based on clock signal 140. For example, clock-activated transistor 128 can be activated upon a rising edge of clock signal 140 (e.g., going from a first level to a second level). In another example, clock-activated transistor 128 can be activated upon a falling edge of clock signal 140 (e.g., going from a second level to a first level). In some implementations, clock-activated transistor 128 is an NFET transistor and clock-activated transistor 150 is a PFET transistor. In various implementations, clock-activated transistor 128 can be configured to enable sampling of storage node X by the third logic gate (in particular transistors 120 and 127) and storage node $X_n$ by the fourth logic gate (in particular transistors 121 and 126).

In various implementations, the third logic gate includes a third pull-up network including transistors 120 and 123 and a third pull-down network including transistors 124 and 127. The fourth logic gate includes a fourth pull-up network including transistors 121 and 122 and a fourth pull-down network including transistors 125 and 126.

In various implementations, each logic gate (e.g., fifth, sixth, seventh, eighth) includes a pull-up network and a pull-down network. For example, the third logic gate includes a third pull-up network including transistors 120 and 123 and a third pull-down network including transistors 124 and 127. In another example, the fourth logic gate includes a fourth pull-up network including transistors 121 and 122 and a fourth pull-down network including transistors 125 and 126.

The keeper subcircuit (sometimes referred to herein as the "second keeper subcircuit") of the slave latch can include transistors 129, 130, 131, and 132. In some implementations, the keeper subcircuit of the slave latch is shown to be clock-gated by clock-activated transistor 150 (sometimes referred to herein as the "first clock-activated transistor") of the master latch, via shared node 147. In particular, the source terminals of transistors 129 and 130 can be electrically coupled to the drain terminal of clock-activated transistor 150 of the master latch.

In some implementations, when the slave latch is opaque (e.g., clock signal 140 is at a first level) and storage node X or $X_n$ changes, storage node Y or $Y_n$ maintains a current path to high power supply, via transistors 129, 132, and 150 for storage node Y and via transistors 130, 131, and 150 for storage node $Y_n$. However, when clock signal 140 transitions to a second level, the slave latch is active and transistor 127 pull-down storage node $Y_n$ via clock-activated transistor 128 to low power supply when storage node X at a second level, or transistor 126 pull-down storage node Y via clock-activated transistor 128 to low power supply when storage node $X_n$ is at a second level. When storage node $Y_n$ transitions to a first level, transistor 122 is activated to pull-up storage node Y to a second level. Likewise, when storage node Y transitions to a first level, transistor 123 is activated to pull-up storage node $Y_n$ to a second level. Despite transistor pair 129/132 or 130/131 being active when clock signal 140 transitions to a second level, storage node Y or $Y_n$ is shown to be cut-off from high power supply by de-activating clock-activated transistor 150, and thereby allowing storage node Y or $Y_n$ to transition to a first level.

In some implementations, drain terminals of transistors 131 and 132 can be electrically coupled to storage node $Y_n$ and Y, respectively, and gate terminals of transistors 131 and 132 can be electrically coupled to storage node Y and $Y_n$, respectively. Furthermore, transistor 130 can be electrically coupled in series to transistor 131, and transistor 129 can be electrically coupled in series to transistor 132. As shown, both source terminals of transistors 129 and 130 are electrically coupled to first clock-activated transistor 150, the gate terminal of transistor 129 is electrically coupled to the third intermediate node 153 of third logic gate, and gate terminal of transistor 130 is electrically coupled to the fourth intermediate node 154 of fourth logic gate.

In some implementations, the second keeper subcircuit, including transistor pairs 130/131 and 129/132, can be activated by the third intermediate node 153 or fourth intermediate node 154 in response to a change in the storage node X 143 when clock signal 140 is at a first level while the slave latch is opaque. The gate terminal of third bottom-most transistor 120 can be electrically coupled to storage node X 143, and the gate terminal of fourth bottom-most transistor 121 can be electrically coupled to storage node $X_n$ 144. When storage node X 143 changes from second level to a first level while clock signal 140 is at a first level, third bottom-most transistor 120 can be activated and conducts a voltage value of $V_T$ to the third intermediate node 153 electrically coupled to gate terminal of transistor 129. Additionally, transistor 132 already is activated by storage node $Y_n$ at a first level. As transistor 129 is activated by voltage value of $V_T$, series-coupled transistors 129 and 132 provide storage node Y 145 with a current path via transistor 150 to high power supply, thereby maintaining storage node Y 145 at a second level. Conversely, when storage node $X_n$ 144 changes from second level to a first level while clock signal 140 is at a first level, fourth bottom-most transistor 121 can be activated and conducts a voltage value of $V_T$ to the fourth intermediate node 154 electrically coupled to gate terminal of transistor 130. Additionally, transistor 131 already is activated by storage node Y 145 at a first level. As transistor 130 is activated by voltage value of $V_T$, series-coupled transistors 130 and 131 provide storage node $Y_n$ 146 with a current path via transistor 150 to high power supply, thereby maintaining storage node $Y_n$ at a second level.

In some implementations, when storage node X 143 is at a first level, transistor 126 can be activated, and when clock signal 140 transitions to a second level, clock-activated transistor 150 can be deactivated to cutoff one current path to the high power supply and enables storage node Y 145 to pull-down to the low power supply via transistors 126 and 128. In various implementations, when storage node Y 145 transitions to a first level, third top-most transistor 123 with gate terminal electrically coupled to storage node Y 145 can be activated and thereby, pull-up the gate terminal of transistor 129 to the high power supply to deactivate the second keeper subcircuit within the slave latch.

In some implementations, when storage node X 143 is at a second level, transistor 127 can be activated, and when clock signal 140 transitions to a second level, clock-activated transistor 150 can be deactivated to cutoff one current path to the high power supply and enables storage node $Y_n$ 146 to pull-down to the low power supply via transistors 127 and 128. In various implementations, when storage node $Y_n$ 146 transitions to a first level, fourth top-most transistor 122 with gate terminal electrically coupled to storage node $Y_n$ 146 can be activated and thereby, pull-up the gate terminal of transistor 130 to the high power supply to deactivate the second keeper subcircuit within the slave latch.

In various implementations, the output signal 149 can be isolated from the internal nodes of the shared clock-activated transistor architecture 100 using an output buffer 133. The output buffer 133 includes NFET and PFET transistors sized to provide additional drive strength to the output signal 133. In some implementations, storage node $Y_n$ can be electrically coupled to the input of output buffer 133, and the output of output buffer 133 is the output signal 149. In various implementations, storage node Y can be electrically coupled to the input of output buffer 133 to generate an inverted output signal. The isolation of internal nodes from the output signal 149 via output buffer 133 can shield noise events on the output signal 149 from coupling onto the storage nodes.

Referring now to FIG. 1B, a block diagram illustrating the shared clock-activated transistor architecture 100 of FIG. 1A, according to an illustrative implementation. The shared clock-activated transistor architecture 100 is shown to include a master keeper unit 170 within the master latch 160, and a slave keeper unit 190 within a slave latch 180. Additionally, clock-activated transistor architecture 100 resembles similar features and functionality, described in detail with reference to FIG. 1A. In particular, unless otherwise noted, like components and elements (e.g., transistors, nodes, signals, etc.) are indicated with like reference numerals. For example, the shared clock-activated transistor architecture 100 includes transistors 128 and 150, nodes 143 (X), 144 ($X_n$), 145 (Y), 146 ($Y_n$), 147 (N1), 148 (N2), and signals 140, 141, 142, and 149, and inverters 133 and 134, all of which resemble similar features and functionality of the same reference numeral of FIG. 1A. For example, main input signal 141 propagates from input of master latch 160 to output (storage node X 143) of master latch 160 when clock signal 140 is at a first level, while storage node X 143 is held stable by master keeper unit 170 when clock signal 140 is at a second level. In another example, storage node X 143 propagates from input of slave latch 180 to output (storage node Y 145) of slave latch 180 and an output signal 149 is generated when clock signal 140 is at a second level while storage node Y 145 is held stable by slave keeper unit 190 when clock signal 140 is at a first level.

Accordingly, as shown, the operations of the shared clock-activated transistor architecture 100 of FIGS. 1A and 1B are fully-static such that all transistor inputs are actively driven to either first or second level during steady state. A plurality of nodes (e.g., storage, intermediate, etc.) of the circuit remains untoggled while input signals (e.g., 141 and/or 142) remain constant. In some implementations, the shared clock-activated transistor architecture 100 can have at most two transistor gate loads presented to clock signal 140.

Figure 2:
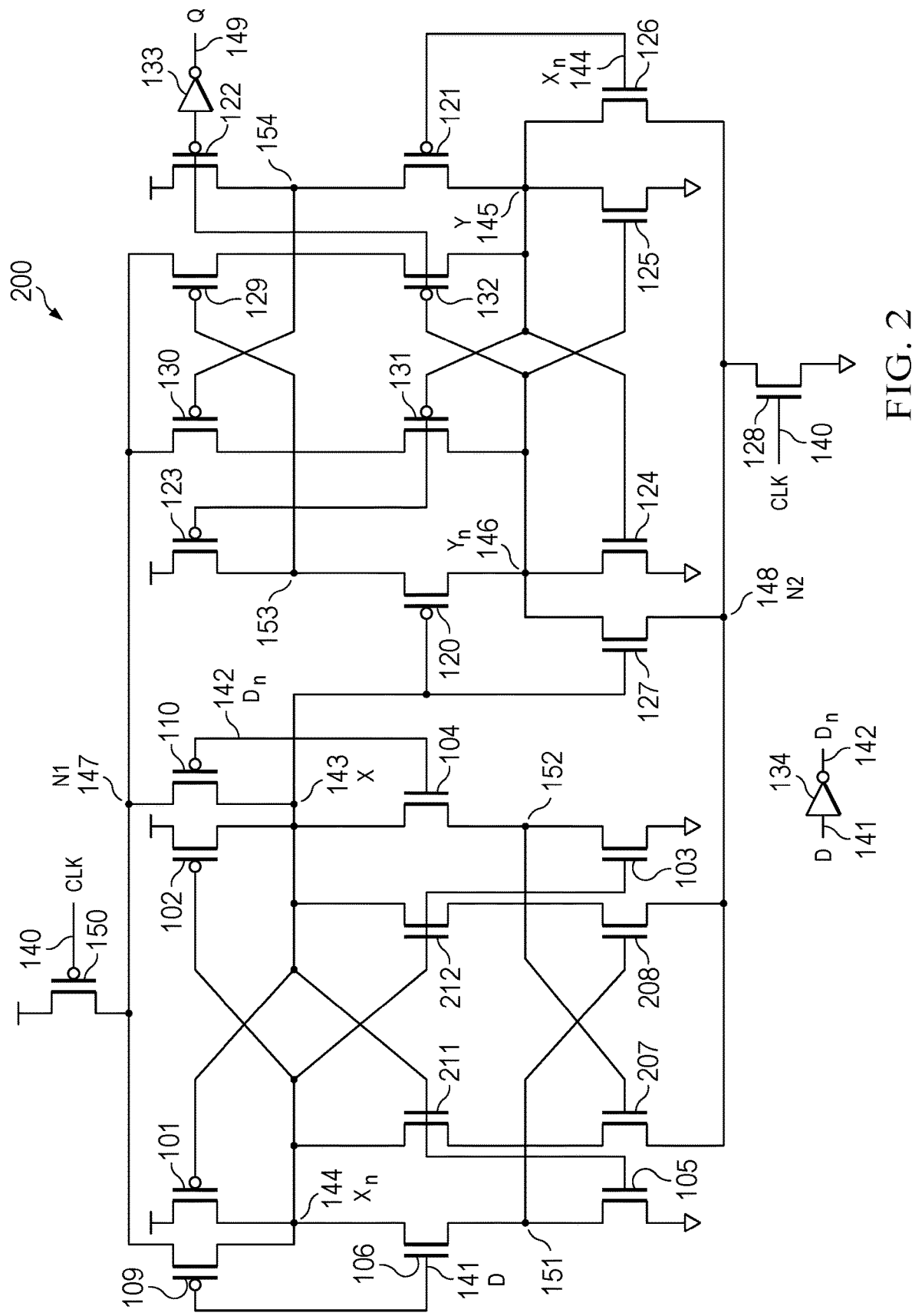
FIG. 2 is a circuit diagram illustrating another shared clock-activated transistor architecture, according to an illustrative implementation.

Referring now to FIG. 2, is a circuit diagram illustrating another shared clock-activated transistor architecture 200 (hereafter referred to herein as "transistor architecture 200"), according to an illustrative implementation. Clock-activated transistor architecture 200 resembles similar features and functionality, described in detail with reference to FIG. 1A. In particular, unless otherwise noted, like components and elements (e.g., transistors, nodes, signals, etc.) are indicated with like reference numerals. For example, the shared clock-activated transistor architecture 200 includes transistors 101-106, 109-110, 120-132, and 150, nodes 143 (X), 144 ($X_n$), 145 (Y), 146 ($Y_n$), 147 (N1), 148 (N2), 151-154, and signals 140, 141, 142, and 149, and inverters 133 and 134, all of which resemble similar features and functionality of the same reference numeral of FIG. 1A.

However, as shown, the first keeper subcircuit within the master latch of FIG. 2 is different from the first keeper subcircuit of FIG. 1A. For example, NFET transistors 207, 208, 211, and 212 operate similarly and include similar features and functionality as PFET transistors 129, 130, 131 and 132 but with operational reference to NFET type transistors. In some implementations, drain terminals of transistors 211 and 212 can be electrically coupled to storage node $X_n$ 144 and X 143, respectively, and gate terminals of transistors 211 and 212 can be electrically coupled to storage node X 143 and $X_n$ 144, respectively. Furthermore, transistor 207 can be coupled in series to transistor 211, and transistor 208 can be coupled in series to transistor 212. As shown, both source terminals of transistors 207 and 208 can be electrically coupled to second clock-activated transistor 128, the gate terminal of transistor 208 can be electrically coupled to the first intermediate node 151 of first logic gate, and the gate terminal of transistor 207 can be electrically coupled to the second intermediate node 152 of second logic gate.

Referring to the first keeper subcircuit of FIG. 2, including transistor pairs 207/211 and 208/212, can be activated by the first intermediate node 151 or second intermediate node 152 in response to a change in the main input signal 141 when clock signal 140 is at a second level while the master latch is opaque. The gate terminal of first top-most transistor 106 can be electrically coupled to main input signal 141, and the gate terminal of second top-most transistor 104 can electrically coupled to inverted main input signal 142. For example, when main input signal 141 changes from first level to a second level while clock signal 140 is at a second level, first top-most transistor 106 can be activated and conduct a voltage value of $V_{DD}$-$V_T$ to the first intermediate node 151 electrically coupled to gate terminal of transistor 208. Transistor 212 already is activated by storage node $X_n$ at a second level. As transistor 208 is activated by voltage value of $V_{DD}$-$V_T$, series-coupled transistors 208 and 212 provide storage node X 143 with a current path via transistor 128 to low power supply, thereby maintaining storage node X 143 at a first level. Conversely, when main input signal 141 changes from a second level to a first level while clock signal 140 is at a second level, second top-most transistor 104 can be activated and conduct a voltage value of $V_{DD}$-$V_T$ to the second intermediate node 152 electrically coupled to gate terminal of transistor 207. Transistor 211 already is activated by storage node X 143 at a second level. As transistor 207 can be activated by voltage value of $V_{DD}$-$V_T$, series-coupled transistors 207 and 211 provide storage node $X_n$ 144 with a current path via transistor 128 to low power supply, thereby maintaining storage node $X_n$ at a first level.

For example, when main input signal 141 at a second level, transistor 110 can be activated. When clock signal 140 transitions to a first level, clock-activated transistor 128 can be deactivated to cutoff one current path to low power supply and enables storage node X 143 to pull-up to high power supply via transistors 110 and 150. When storage node X 143 transitions to a second level, first bottom-most transistor 105 with gate terminal electrically coupled to storage node X 143 can be activated and thereby, pull-down the gate terminal of transistor 208 to low power supply to deactivate the second keeper subcircuit within the slave latch.

In yet another example, when main input signal 141 is at a first level, transistor 109 can be activated. When clock signal 140 transitions to a first level, clock-activated transistor 128 can be deactivated to cutoff one current path to low power supply and enables storage node $X_n$ 144 to pull-up to high power supply via transistors 109 and 150. When storage node $X_n$ 144 transitions to a second level, second bottom-most transistor 103 with gate terminal electrically coupled to storage node $X_n$ 144 can be activated and thereby, pull-down the gate terminal of transistor 207 to low power supply to deactivate the second keeper subcircuit within the slave latch.

Figure 3:
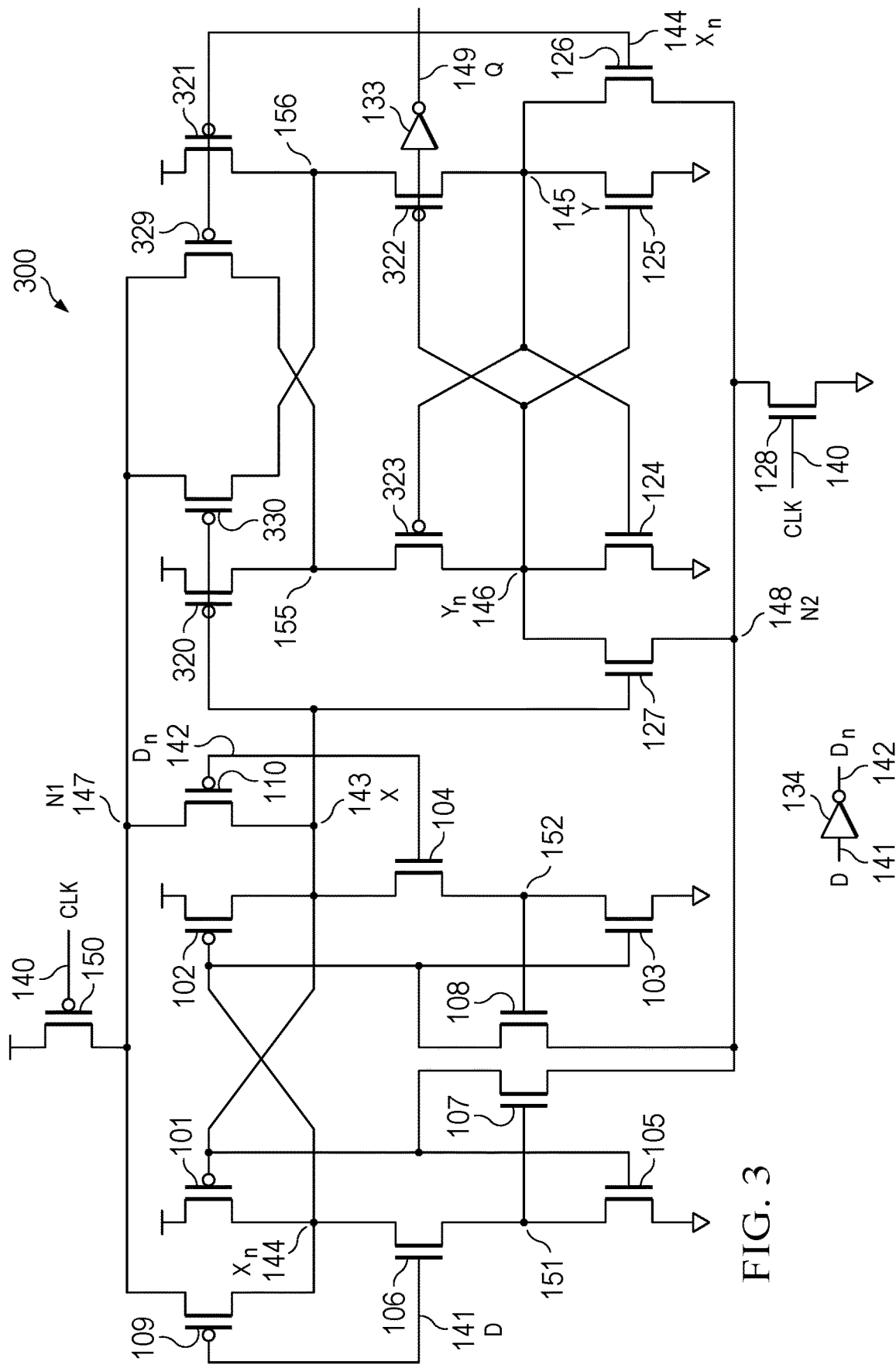
FIG. 3 is a circuit diagram illustrating another shared clock-activated transistor architecture, according to an illustrative implementation.

Referring now to FIG. 3, a circuit diagram illustrating another shared clock-activated transistor architecture 300 (hereafter referred to herein as "transistor architecture 300"), according to an illustrative implementation. Clock-activated transistor architecture 300 resembles similar features and functionality, described in detail with reference to FIG. 1A. In particular, unless otherwise noted, like components and elements (e.g., transistors, nodes, signals, etc.) are indicated with like reference numerals. For example, the shared clock-activated transistor architecture 300 includes transistors 101-110, 124-128, and 150, nodes 143 (X), 144 ($X_n$), 145 (Y), 146 ($Y_n$), 147 (N1), 148 (N2), 151-152, and signals 140, 141, 142, and 149, and inverters 133 and 134, all of which resemble similar features and functionality of the same reference numeral of FIG. 1A.

However, as shown, the pull-up network of the slave latch including the second keeper subcircuit within the slave latch is different from that of FIG. 1A. The pull-up network of the slave latch includes transistors 320, 321, 322, and 323. The second keeper subcircuit within the slave latch includes transistors 329 and 330. In reference to FIG. 1A, the stack order of the third pull-up network for the third logic gate is reversed. The gate terminal of third top-most transistor 320 can be electrically coupled to storage node X 143, and the gate terminal of third bottom-most transistor 323 is electrically coupled to storage node Y 145. Furthermore, the stack order of the fourth pull-up network for the fourth logic gate is reversed. The gate terminal of fourth top-most transistor 321 can be electrically coupled to storage node $X_n$ 144, and the gate terminal of fourth bottom-most transistor 322 can be electrically coupled to storage node $Y_n$ 146. In some implementations, drain terminals of transistors 329 and 330 can be electrically coupled to third intermediate node 155 and fourth intermediate node 156, respectively. The source terminals of transistors 329 and 330 can be electrically coupled to first clock-activated transistor 150. The gate terminal of transistor 329 can be electrically coupled to storage node $X_n$ 144, and the gate terminal of transistor 330 is electrically coupled to storage node X 143.

Referring to the operation of the second keeper subcircuit within the slave latch in more detail. When storage node $Y_n$ 146 is at second level while storage node X 143 is at first level and clock signal 140 is at first level (e.g., slave latch is opaque), transistors 320 and 323 can be activated to provide storage node $Y_n$ 146 with a current path to high power supply. When storage node X 143 changes from first level to second level while clock signal 140 remains at first level, transistor 329 can be activated as the gate terminal of transistor 329 can be electrically coupled to storage node $X_n$ 144 at first level. Even with transistor 320 deactivated, transistors 323 and 329 provide storage node $Y_n$ 146 with a current path via clock-activated transistor 150 to high power supply. Conversely, when storage node Y 145 is at second level while storage node X 143 is at second level and clock signal 140 is at first level (e.g., slave latch is opaque), transistors 321 and 322 can be activated to provide storage node Y 145 with a current path to high power supply. When storage node X 143 changes from second level to first level while clock signal 140 remains at first level, transistor 330 can be activated as the gate terminal of transistor 330 can be electrically coupled to storage node X 143 at first level. Even with transistor 321 deactivated, transistors 322 and 330 provide storage node Y 145 with a current path via clock-activated transistor 150 to high power supply.

Figure 4:
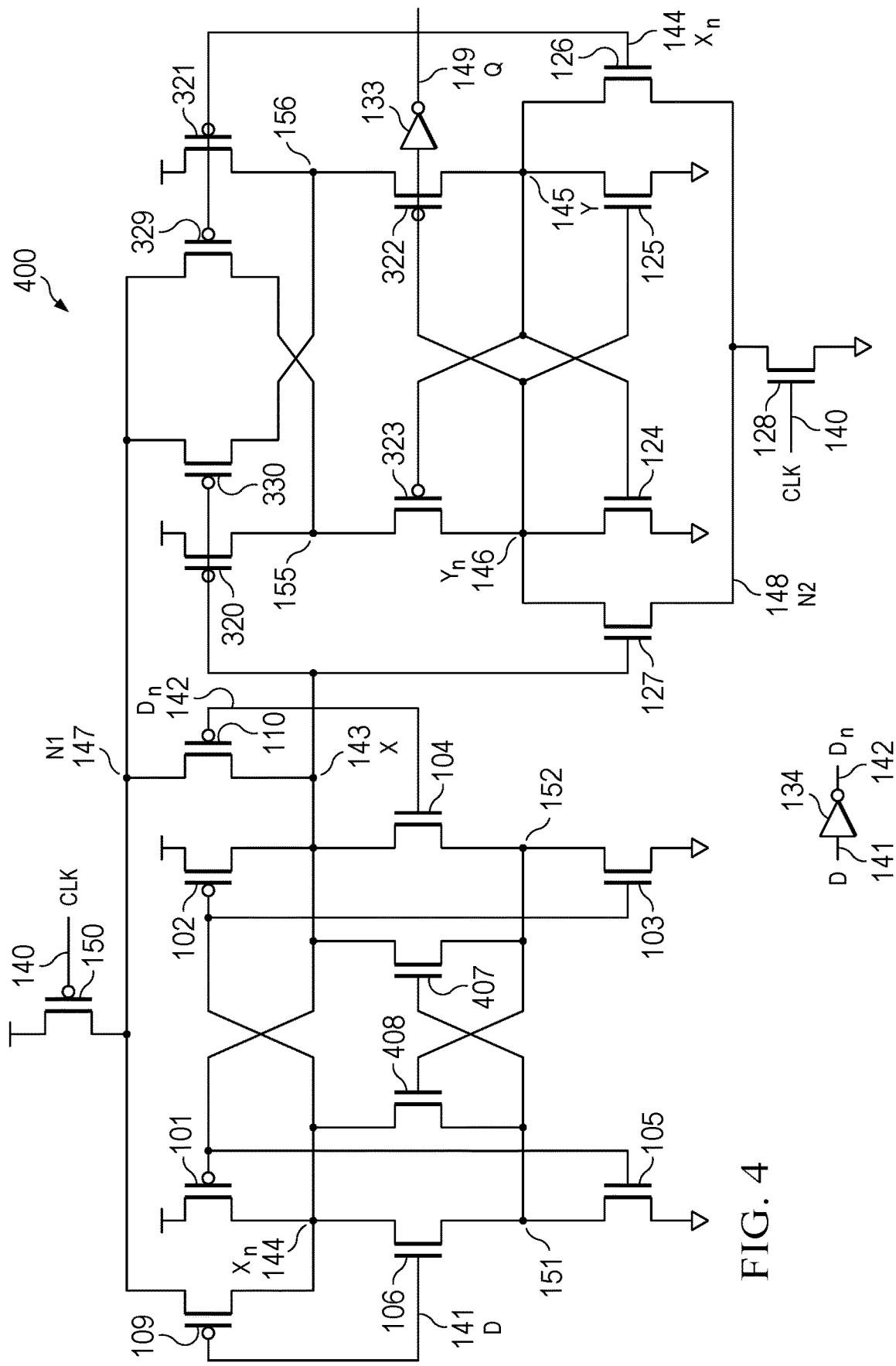
FIG. 4 is a circuit diagram illustrating another shared clock-activated transistor architecture, according to an illustrative implementation.

Referring now to FIG. 4, a circuit diagram illustrating another shared clock-activated transistor architecture 400 (hereafter referred to herein as "transistor architecture 400"), according to an illustrative implementation. Clock-activated transistor architecture 400 resembles similar features and functionality, described in detail with reference to FIG. 1A. In particular, unless otherwise noted, like components and elements (e.g., transistors, nodes, signals, etc.) are indicated with like reference numerals. For example, the shared clock-activated transistor architecture 400 includes transistors 101-106, 109-110, 124-128, 150, 320-323, and 329-330, nodes 143 (X), 144 (X$_n$), 145 (Y), 146 (Y$_n$), 151-152, and 155-156 and signals 140, 141, 142, and 149, and inverters 133 and 134, all of which resemble similar features and functionality of the same reference numeral of FIG. 1A and FIG. 3.

However, as shown the first keeper subcircuit within the master latch is different from the first keeper subcircuit of FIG. 3. The first keeper subcircuit within the master latch includes transistors 407 and 408. In some implementations, drain terminals of transistors 407 and 408 can be electrically coupled to storage node X 143 and X$_n$ 144, respectively. The source terminal of transistor 407 can be electrically coupled to the gate terminal of transistor 408 and also electrically coupled to second intermediate node 152. The source terminal of transistor 408 can be electrically coupled to the gate of transistor 407 and also electrically coupled to first intermediate node 151. In some implementations, the first keeper subcircuit does not couple to any clock-activated transistors.

Referring to the operation of the second keeper subcircuit within the slave latch in more detail. The first keeper subcircuit can be activated by the first intermediate node 151 or second intermediate node 152 in response to a change in the input signal 141 when clock signal 140 is at second level while the master latch is opaque. The gate terminal of first top-most transistor 106 can be electrically coupled to main input signal 141, and the gate terminal of second top-most transistor 104 can be electrically coupled to inverted main input signal 142. When input signal 141 changes from first level to second level while clock signal 140 is at second level, first top-most transistor 106 can be activated and conduct a voltage value of V$_{DD}$-V$_T$ to the first intermediate node 151 electrically coupled to gate terminal of transistor 407, thereby activating transistor 407. Storage node X 143 can be held at first level by transistors 103 and 104, however, transistor 104 can be deactivated after input signal 141 transitions to second level. Transistor 407 can function as a bypass transistor for deactivated transistor 104 to maintain a current path for storage node X 143 to low power supply. Conversely, when input signal 141 changes from second level to first level while clock signal 140 is at second level, second top-most transistor 104 can be activated and conduct a voltage value of V$_{DD}$-V$_T$ to the second intermediate node 152 electrically coupled to gate terminal of transistor 408, thereby activating transistor 408. Storage node X$_n$ 144 can be held at first level by transistors 105 and 106, however, transistor 106 can be deactivated after input signal 141 transitions to first level. Transistor 408 can function as a bypass transistor for deactivated transistor 106 to maintain a current path for storage node X$_n$ 144 to low power supply.

For example, when input signal 141 is at second level, transistor 110 can be activated. When clock signal 140 transitions to first level, transistors 110 and 150 pull-up storage node X 143 to second level. When storage node X 143 transitions to second level, first bottom-most transistor 105 can be activated to pull-down first intermediate node 151 to low power supply, and thereby, deactivating transistor 407 to deactivate the first keeper subcircuit within the master latch. When input signal 141 is at first level, transistor 109 can be activated. When clock signal 140 transitions to first level, transistors 109 and 150 pull-up storage node X$_n$ 144 to second level. When storage node X$_n$ 144 transitions to second level, second bottom-most transistor 103 can be activated to pull-down second intermediate node 152 to low power supply, and thereby, deactivating transistor 408 to deactivate the first keeper subcircuit within the master latch.

Figure 5A:
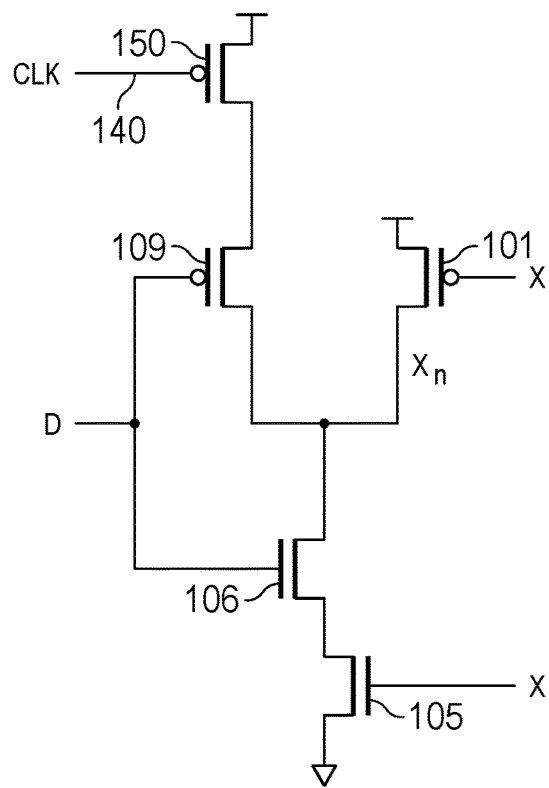
FIGS. 5A-5D are circuit diagrams illustrating subcircuits of the shared clock-activated transistor architecture of FIG. 1A, according to an illustrative implementation.
Figure 5B:
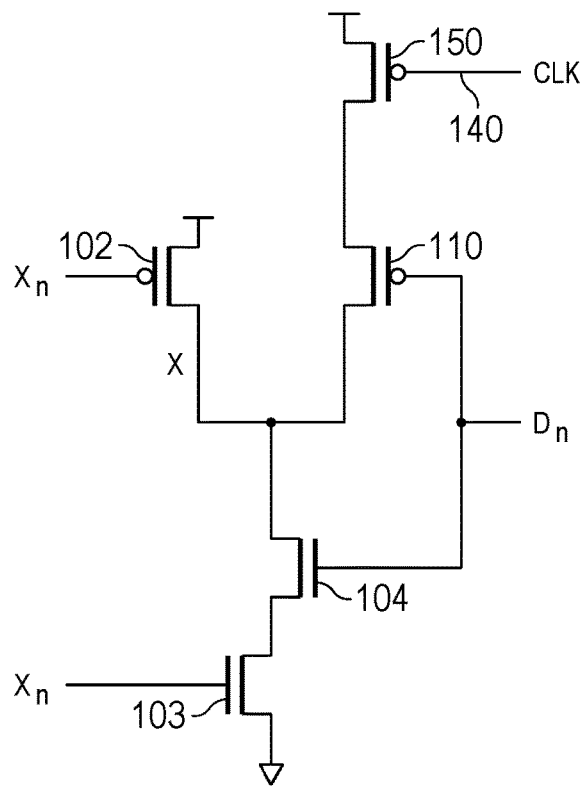
Figure 5C:
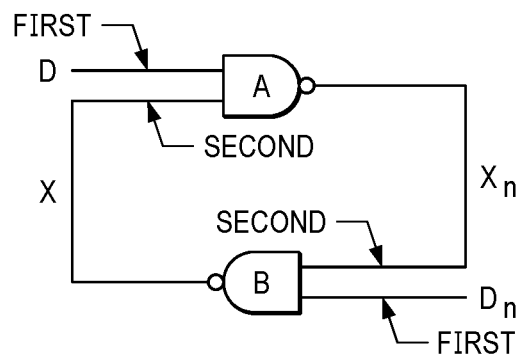
Figure 5D:
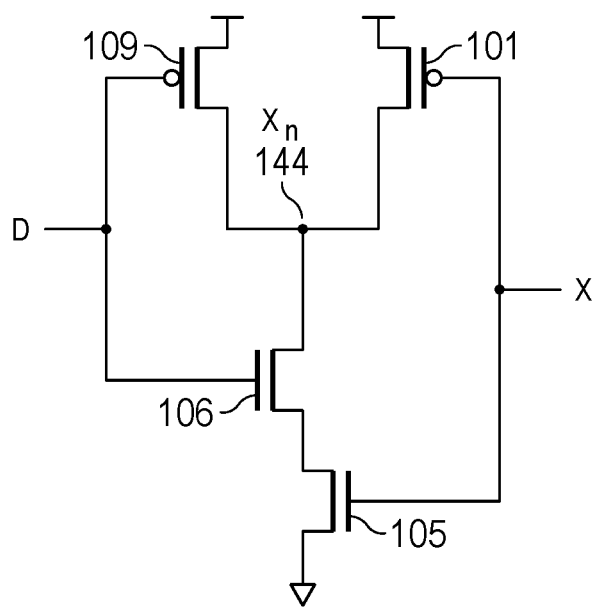

Referring now to FIGS. 5A-5D and 6A-6D, circuit diagrams illustrating subcircuits of the shared clock-activated transistor architecture 100 of FIG. 1A, according to an illustrative implementation. In an illustrative example, FIGS. 5A-5D depicts the first and second logic gates of the master latch being cross-coupled NAND gates (FIG. 5C). In some implementations, the first logic gate can sample the main input signal 141 and the second logic gate can sample the inverted main input signal 142 when the clock signal 140 is at first level. The sampling operations are described in detail with reference to transistor architectures 100-400. For example, when input signal 141 is at second level, transistors 106 and 110 can be activated. As the clock signal 140 transitions to a first level, transistors 110 and 150 pull-up storage node X 143 to a second level and thereby, activates transistor 105. Transistors 105 and 106 pull-down storage node X$_n$ 144 to a first level and thereby, latches main input signal 141 onto storage node X 143. As clock signal 140 transitions to a second level (e.g., master latch being opaque), storage node X 143 can be held at a second level by transistor 102 and storage node X$_n$ 144 can be held at a first level by transistors 105 and 106. Furthermore, first transistor 109 and third transistor 110 of the first and second logic gates, respectively, can be clock-gated by first activated transistor 150 to block the master latch from sampling changes in the main input signal 141 while the clock signal 140 remains at a second level. FIG. 5D depicts the main input signal 141 being electrically coupled to the first or second top-most transistor of the first or second logic gate for the first keeper subcircuit within the master latch to be activated by the first or second intermediate node.

Figure 6A:
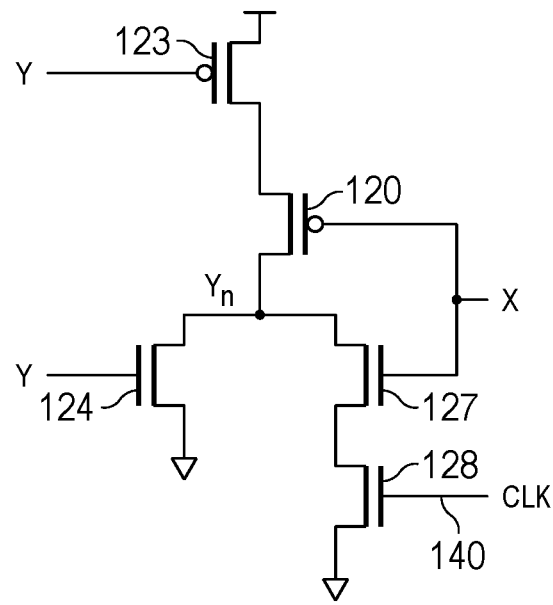
FIGS. 6A-6D are circuit diagrams illustrating subcircuits of the shared clock-activated transistor architecture of FIG. 1A, according to an illustrative implementation.
Figure 6B:
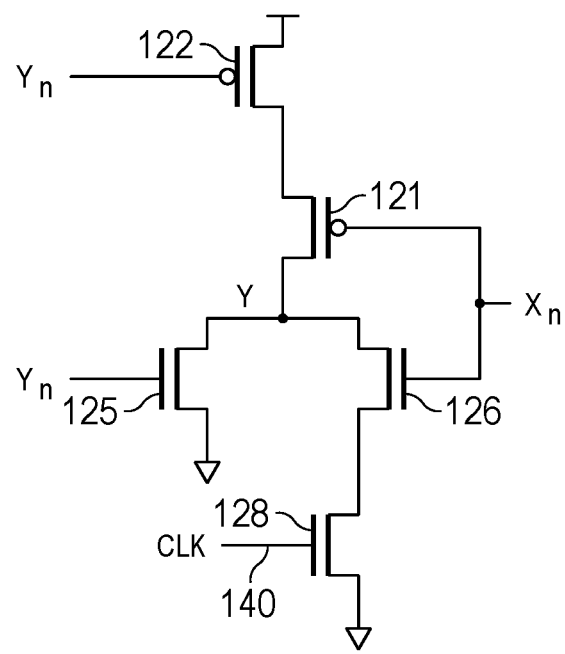
Figure 6C:
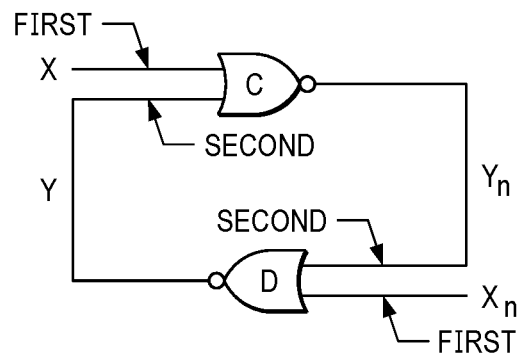
Figure 6D:
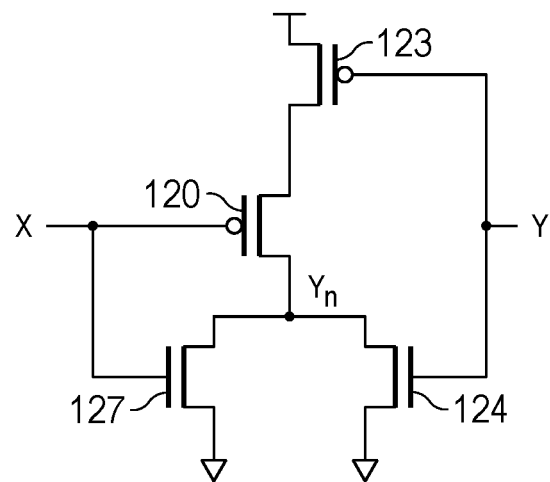

In an illustrative example, FIGS. 6A-6D depicts the third and fourth logic gates of the slave latch being cross-coupled NOR gates (FIG. 6C). The third logic gate can sample storage node X 143 and the fourth logic gate can sample storage node X$_n$ 144 when the clock signal 140 is at a second level. When storage node X 143 is at a second level, transistors 121 and 127 can be activated. As the clock signal 140 transitions to a second level, transistors 127 and 128 pull-down storage node Y$_n$ 146 to a first level and thereby, activates transistor 122. Transistors 121 and 122 pull-up storage node Y 145 to second level and thereby, latches storage node X 143 onto storage node Y 145 and generates an output signal 149 in accordance with the sampled main input signal 141. As clock signal 140 transitions to a first level (e.g., slave latch being opaque), storage node Y$_n$ 146 is held at a first level by transistor 124 and storage node Y 145 is held at a second level by transistors 121 and 122. Furthermore, fifth transistor 127 and seventh transistor 126 of the third and fourth logic gates, respectively, can be clock-gated by second activated transistor 128 to block the slave latch from sampling changes in the storage node X 143 while the clock signal 140 remains at a first level. FIG. 6D illustrates the storage node X 143 being electrically coupled to the third or fourth bottom-most transistor of the third or fourth logic gate for the second keeper subcircuit within the slave latch to be activated by the third or fourth intermediate node.

Figure 7:
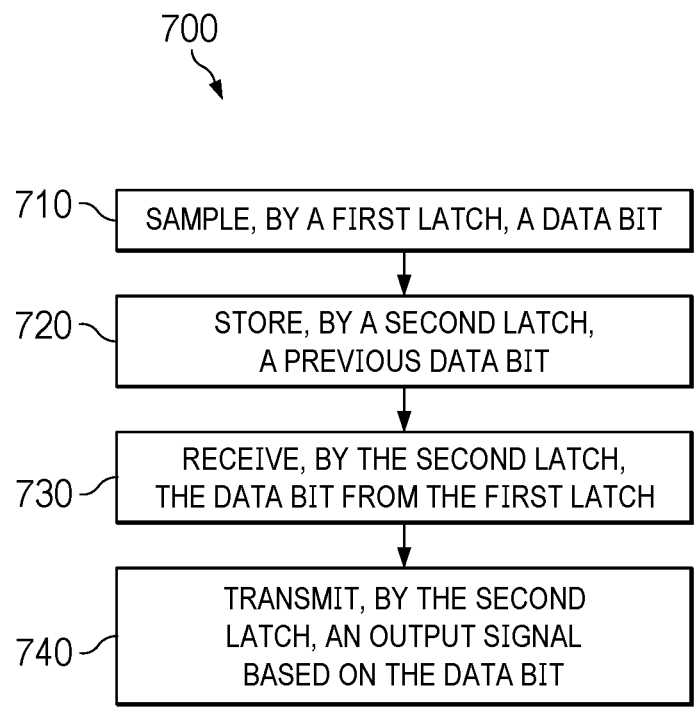
FIG. 7 is a flowchart for a method of generating data outputs based on sampled data inputs, according to an illustrative implementation.

Referring now to FIG. 7, a flowchart for a method 700 of generating data outputs based on sampled data inputs, according to an illustrative implementation. Clock-activated transistor architecture 100 can be configured to perform method 700. Further, any clock-activated transistor architecture (e.g., 100-400) described herein can be configured to perform method 700.

In broad overview of method 700, at block 710, when the clock signal is at a first level, a first latch (e.g., 160) of the clock-activated transistor architecture (e.g., 100) can sample a data bit (e.g., 141 and/or 142). At block 720, when the clock signal is at the first level, a second latch (e.g., 180) of the clock-activated transistor architecture can sample (or store) a previous data bit (e.g., 145 and/or 146). At block 730, when the clock signal is at a second level (i.e., different than the first level), the second latch of the clock-activated transistor architecture can receive the data bit (e.g., 143 and/or 144) from the first latch. At block 740, when the clock signal is at the second level, the second latch of the clock-activated transistor architecture can transmit an output signal (e.g., 149) based on the data bit. Additional, fewer, or different operations may be performed depending on the particular implementation. In some implementations, each operation may be re-ordered, added, removed, or repeated.

Referring to method 700 in more detail, at block 710 the data is the current data bit (e.g., N) of the input signal (e.g., 141 or 142) sampled by the first latch. At block 720 the previous data bit is the previously sampled data bit (e.g., N−1) by the first latch. At block 730, the data bit is the sampled data bit (e.g., N) of block 710. At block 740, the received data bit is also the current data bit (e.g., N). In some implementations, the first latch can be electrically coupled to the second latch via a plurality of nodes (e.g., storage nodes X and $X_n$), and the first latch and the second latch can share a low-power supply node (e.g., 148) and a high-power supply node (e.g., 147). In some implementations, the high-power supply node is electrically coupled to a first clock-activated transistor (e.g., 150), and the low-power supply node is electrically coupled to a second clock-activated transistor (e.g., 128). In various implementations, a next data is the new sampled data bit (e.g., N+1). For example, when the clock signal is at the second level, the first latch of the clock-activated transistor architecture can sample a next data bit (e.g., 141 and/or 142 such that it blocks propagation of changes in the data bit from being sampled, however, proceeds to sample next data bit when the clock signal transitions to a first level).

In various implementations, the first latch (e.g., 160) includes a first logic gate, a second logic gate, and a first keeper subcircuit. In particular, the first keeper subcircuit can be electrically coupled to a first intermediate node (e.g., 151) and a second intermediate node (e.g., 152), and where the first keeper subcircuit includes at least a first transistor (e.g., 107) and a second transistor (e.g., 108). Additionally, the first transistor can be electrically coupled to the first intermediate node and the second transistor can be electrically coupled to the second intermediate node. Accordingly, both the first transistor and the second transistor can be electrically cross coupled to the first intermediate node and the second intermediate node. In some implementations, the first keeper subcircuit can be electrically coupled to a low-power supply node (e.g., 148) and to storage nodes of the first latch (e.g., X and $X_n$, sometimes referred to as "outputs"). In various implementations, the first keeper subcircuit can include at most two transistors (e.g., FIGS. 1, 3, and 4). In some implementations, the first keeper subcircuit can include at most four transistors (e.g., FIGS. 1-4).

In some implementations, the second latch (e.g., 180) includes a third logic gate, a fourth logic gate, and a second keeper subcircuit. In particular, the second keeper subcircuit can be electrically coupled to a third intermediate node (e.g., 153) and a fourth intermediate node (e.g., 154), and where the second keeper subcircuit includes at least a third transistor (e.g., 130) and a fourth transistor (e.g., 129). Additionally, the third transistor can be electrically coupled to the fourth intermediate node and the fourth transistor can be electrically coupled to the third intermediate node. Accordingly, the second keeper subcircuit can be electrically coupled to a high-power supply node (e.g., 147) and to storage nodes of the second latch (e.g., Y and $Y_n$) (with reference to FIGS. 1-2). Alternatively, the second keeper subcircuit can be electrically coupled to a high-power supply node and to storage nodes of the first latch (e.g., X and $X_n$) (with reference to FIGS. 3-4). In various implementations, the second keeper subcircuit can include at most two transistors (e.g., FIGS. 3-4). In some implementations, the second keeper subcircuit can include at most four transistors (e.g., FIGS. 1-4).

Accordingly, the following illustrates the flow of a data bit from input to output of the transistor architecture 100-400. When main input signal is at second level while clock signal is at first level (e.g., data bit with high logic value being sampled), storage node $X_n$ transitions to first level and storage node X transitions to second level. When clock signal transitions to second level, storage node Y changes to second level and storage node $Y_n$ changes to first level, and an output signal at second level is generated. Conversely, when main input signal is at first level while clock signal is at first level (e.g., data bit with low logic value being sampled), storage node $X_n$ transitions to second level and storage node X transitions to first level. When clock signal transitions to second level, storage node Y changes to first level and storage node $Y_n$ changes to second level, and an output signal at first level is generated.

While this specification contains many specific implementation details, these should not be construed as limitations on the scope of any inventions or of what may be claimed, but rather as descriptions of features specific to particular implementations of the systems and methods described herein. Certain features that are described in this specification in the context of separate implementations can also be implemented in combination in a single implementation. Conversely, various features that are described in the context of a single implementation can also be implemented in multiple implementations separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. In some cases, the actions recited in the claims can be performed in a different order and still achieve desirable results. In addition, the processes depicted in the accompanying figures do not necessarily require the particular order shown, or sequential order, to achieve desirable results.

Having now described some illustrative implementations it is apparent that the foregoing is illustrative and not limiting, having been presented by way of example. In particular, although many of the examples presented herein involve specific combinations of method acts or system elements or components, those acts, and those elements may be combined in other ways to accomplish the same objectives. Acts, elements and features discussed only in connection with one implementation are not intended to be excluded from a similar role in other implementations.

The phraseology and terminology used herein is for the purpose of description and should not be regarded as limiting. The use of "including" "comprising" "having" "containing" "involving" "characterized by" "characterized in that" and variations thereof herein, is meant to encompass the components items listed thereafter, equivalents thereof, and additional items, as well as alternate implementations consisting of the items listed thereafter exclusively. In one implementation, the systems and methods described herein consist of one, each combination of more than one, or all of the described elements, acts, or components.

Any references to implementations or elements or acts of the systems and methods herein referred to in the singular may also embrace implementations including a plurality of these elements or components, and any references in plural to any implementation, arrangement, or element or act herein may also embrace implementations including only a single element or component. References in the singular or plural form are not intended to limit the presently disclosed systems or methods, their components, acts, or elements to single or plural configurations. References to any act or element being based on any information, act or element may include implementations where the act or element is based at least in part on any information, act, or element.

Any implementation disclosed herein may be combined with any other implementation, and references to "an implementation," "some implementations," "an alternate implementation," "various implementation," "one implementation" or the like are not necessarily mutually exclusive and are intended to indicate that a particular feature, structure, or characteristic described in connection with the implementation may be included in at least one implementation. Such terms as used herein are not necessarily all referring to the same implementation. Any implementation may be combined with any other implementation, inclusively or exclusively, in any manner consistent with the aspects and implementations disclosed herein.

References to "or" may be construed as inclusive so that any terms described using "or" may indicate any of a single, more than one, and all of the described terms.

Where technical features in the drawings, detailed description or any claim are followed by reference signs, the reference signs have been included for the sole purpose of increasing the intelligibility of the drawings, detailed description, and claims. Accordingly, neither the reference signs nor their absence have any limiting effect on the scope of any claim elements.

The systems and methods described herein may be embodied in other specific forms without departing from the characteristics thereof. Although the examples provided herein relate to systems (e.g., circuits) and methods for generating data outputs utilizing shared clock-activated transistors, the systems and methods described herein can be applied to other circuits and methods. The foregoing implementations are illustrative rather than limiting of the described systems and methods. Scope of the systems and methods described herein is thus indicated by the appended claims, rather than the foregoing description, and changes that come within the meaning and range of equivalency of the claims are embraced therein.

What is claimed is:

1. A circuit for generating data outputs based on sampled data inputs, the circuit comprising:
    a first latch comprising:
        a first logic gate electrically coupled to a second output of a second logic gate; the second logic gate electrically coupled to a first output of the first logic gate;
        a first keeper subcircuit electrically coupled to a first intermediate node of the first logic gate and a second intermediate node of the second logic gate;
        a first clock-activated transistor configured to enable sampling of a main input signal by the first logic gate and an inverted main input signal by the second logic gate; and
        a plurality of storage nodes configured to store a latched data bit of the main input signal and store a latched data bit of the inverted main input signal, wherein the plurality of storage nodes are electrically coupled to the first output of the first logic gate and the second output of the second logic gate
    a second latch comprising:
        a third logic gate electrically coupled to the second output of the second logic gate and a fourth output of a fourth logic gate;
        the fourth logic gate electrically coupled to the first output of the first logic gate and a third output of the third logic gate; and
        a second keeper subcircuit electrically coupled to a third intermediate node of the third logic gate and a fourth intermediate node of the fourth logic gate;
    wherein the first keeper subcircuit is electrically coupled via a first shared node of the first latch and the second latch, wherein the second keeper subcircuit is electrically coupled via a second shared node of the first latch and the second latch
    wherein the first keeper subcircuit is activated by the first intermediate node or the second intermediate node in response to a change in the main input signal when a clock signal is at a second level, and wherein the second keeper subcircuit is activated by the third intermediate node or the fourth intermediate node in response to a change in the first output and the second output of the first latch when the clock signal is at a first level.

2. The circuit of claim 1, the second latch further comprising:
    a second clock-activated transistor configured to enable sampling of the first output of the first logic gate and the second output of the second logic gate.

3. The circuit of claim 2, wherein the first keeper subcircuit is clock-gated by the second clock-activated transistor of the second latch, and wherein the second keeper subcircuit is clock-gated by the first clock-activated transistor of the first latch.

4. The circuit of claim 3, wherein the first logic gate comprises a first pull-up network and a first pull-down network, and wherein the second logic gate comprises a second pull-up network and a second pull-down network, and wherein the first pull-up network comprises at least a first transistor and a second transistor, and wherein the second pull-up network comprises at least a third transistor and a fourth transistor, and wherein the first transistor and the third transistor are clock-gated by the first clock-activated transistor of the first latch.

5. The circuit of claim 3, wherein the third logic gate comprises a third pull-up network and a third pull-down network, and wherein the fourth logic gate comprises a fourth pullup network and a fourth pull-down network, and wherein the third pull-down network comprises at least a fifth transistor and a sixth transistor, and wherein the fourth pull-down network comprises at least a seventh transistor and an eighth transistor, and wherein the fifth transistor and the seventh transistor are clock-gated by the second clock-activated transistor of the second latch.

6. The circuit of claim 3, wherein the first intermediate node and the second intermediate node are electrically coupled to the inputs of the first keeper subcircuit, and wherein a top-most transistor of the first pull-down network in the first logic gate is electrically coupled to the main input signal, and wherein a top-most transistor of the second pull-down network of the second logic gate is electrically coupled to the inverted main input signal.

7. The circuit of claim 3, wherein the third intermediate node and the fourth intermediate node are electrically coupled to the inputs of the second keeper subcircuit, and wherein bottom-most transistor of the third pull-up network in the third logic gate is electrically coupled to the second output of the second logic gate, and wherein the bottom-most transistor of the fourth pull-up network of the fourth logic gate is electrically coupled to the first output of the first logic gate.

8. The circuit of claim 1, wherein the first keeper subcircuit is electrically coupled to the outputs of the first latch, and the second keeper subcircuit is electrically coupled to outputs of the second latch, and wherein the operation of the circuit is fully static, and wherein each of a plurality of nodes of the circuit remains untoggled while the main input signal remains constant, and wherein at most two transistor gate loads are presented to a clock signal.

9. A method for generating data outputs based on sampled data inputs, the method comprising:
when a clock signal is at a first level:
sampling, by a first latch, a data bit; and
storing, by a second latch, a previous data bit;
when the clock signal is at a second level:
receiving, by the second latch, the data bit from the first latch; and
transmitting, by the second latch, an output signal based on the data bit;
wherein a first keeper subcircuit is electrically coupled via a first shared node of the first latch and the second latch,
wherein a second keeper subcircuit is electrically coupled via a second shared node of the first latch and the second latch;
wherein the first latch comprises a first logic gate, a second logic gate, and the first keeper subcircuit,
wherein the first keeper subcircuit is electrically coupled to a first intermediate node and a second intermediate node;
wherein the first keeper subcircuit comprises at least a first transistor and a second transistor;
wherein both the first transistor and the second transistor are electrically cross coupled to the first intermediate node and the second intermediate node without electrically coupling to a low-power supply node or a high-power supply node.

10. The method of claim 9, wherein the first latch is electrically coupled to the second latch via a plurality of nodes, and wherein the first latch and the second latch share a low-power supply node and a high-power supply node, and wherein the high-power supply node is electrically coupled a first clock-activated transistor, and wherein the low-power supply node is electrically coupled a second clock-activated transistor.

11. The method of claim 9, wherein the first transistor is electrically coupled to the first intermediate node and the second transistor is electrically coupled to the second intermediate node.

12. The method of claim 9, wherein the first keeper subcircuit is electrically coupled to a low-power supply node, and wherein the first keeper subcircuit is electrically coupled to storage nodes of the first latch, and wherein the first keeper subcircuit comprises at most two transistors or at most four transistors.

13. The method of claim 9, wherein the second latch comprises a third logic gate, a fourth logic gate, and the second keeper subcircuit, wherein the second keeper subcircuit is electrically coupled to a third intermediate node and a fourth intermediate node, and wherein the second keeper subcircuit comprises at least a third transistor and a fourth transistor, and wherein the third transistor is electrically coupled to the fourth intermediate node and the fourth transistor is electrically coupled to the third intermediate node.

14. The method of claim 13, wherein the second keeper subcircuit is electrically coupled to a high-power supply node, and wherein the second keeper subcircuit is electrically coupled to storage nodes of the second latch.

15. The method claim 13, wherein the second keeper subcircuit is electrically coupled to a high-power supply node, and wherein the second keeper subcircuit is electrically coupled to storage nodes of the first latch, and wherein the second keeper subcircuit comprises at most two transistors or at most four transistors.

16. A circuit for generating data output based on a sampled data input, the circuit comprising:
a first latch comprising:
a first logic gate comprising a first input and a second input, wherein the first input is electrically coupled to an input signal, and the second input is electrically coupled to an output of a second logic gate;
the second logic gate comprising a third input and a fourth input, wherein the third input is electrically coupled to an inverted input signal, and the fourth input is electrically coupled to the output of the first logic gate;
a first keeper subcircuit electrically coupled to a first intermediate node of the first logic gate and a second intermediate node of the second logic gate;
a first plurality of storage nodes configured to store a latched data bit of the main input signal and store a latched data bit of the inverted main input signal, wherein the plurality of storage nodes are electrically coupled to the first output of the first logic gate and the second output of the second logic gate; and
a first clock-activated transistor configured to enable sampling of the input signal by the first logic gate and the inverted input signal by the second logic gate;
a second latch comprising:
a third logic gate comprising a fifth input and a sixth input, wherein the fifth input is electrically coupled to the output of the second logic gate, and the sixth input is electrically coupled to an output of a fourth logic gate;
the fourth logic gate comprising a seventh input and an eighth input, wherein the seventh input is electrically coupled to the output of the first logic gate, and the eighth input is electrically coupled to an output of the third logic gate;
a second keeper subcircuit electrically coupled to a third intermediate node of the third logic gate and a fourth intermediate node of the fourth logic gate;
a second plurality of storage nodes; and
a second clock-activated transistor configured to enable sampling of outputs of the first logic gate and the second logic gate, wherein the first keeper subcircuit is clock-gated by the second clock-activated transistor, wherein the second keeper subcircuit is clock gated by the first clock-activated transistor;

wherein the first keeper subcircuit is electrically coupled via a first shared node of the first latch and the second latch, wherein the second keeper subcircuit is electrically coupled via a second shared node of the first latch and the second latch;

wherein the third intermediate node and the fourth intermediate node are electrically coupled to the inputs of the second keeper subcircuit, and wherein bottom-most transistor of the third pull-up network in the third logic gate is electrically coupled to the second output of the second logic gate, and wherein the bottom-most transistor of the fourth pull-up network of the fourth logic gate is electrically coupled to the first output of the first logic gate.

* * * * *